Sept. 29, 1959 A. R. SALTZMAN 2,906,103

CHASSIS DESIGN FOR INERT CARRIER GAS-LIQUID THERMAL DIFFUSION COOLING SYSTEM

Filed June 10, 1957 2 Sheets-Sheet 1

INVENTOR.
ALVIN R. SALTZMAN

BY [signature]
ATTORNEYS

INVENTOR.
ALVIN R. SALTZMAN
BY
[signature]
ATTORNEYS

United States Patent Office 2,906,103

Patented Sept. 29, 1959

2,906,103

CHASSIS DESIGN FOR INERT CARRIER GAS-LIQUID THERMAL DIFFUSION COOLING SYSTEM

Alvin R. Saltzman, Willow Grove, Pa.

Application June 10, 1957, Serial No. 664,865

3 Claims. (Cl. 62—231)

Figure 1:
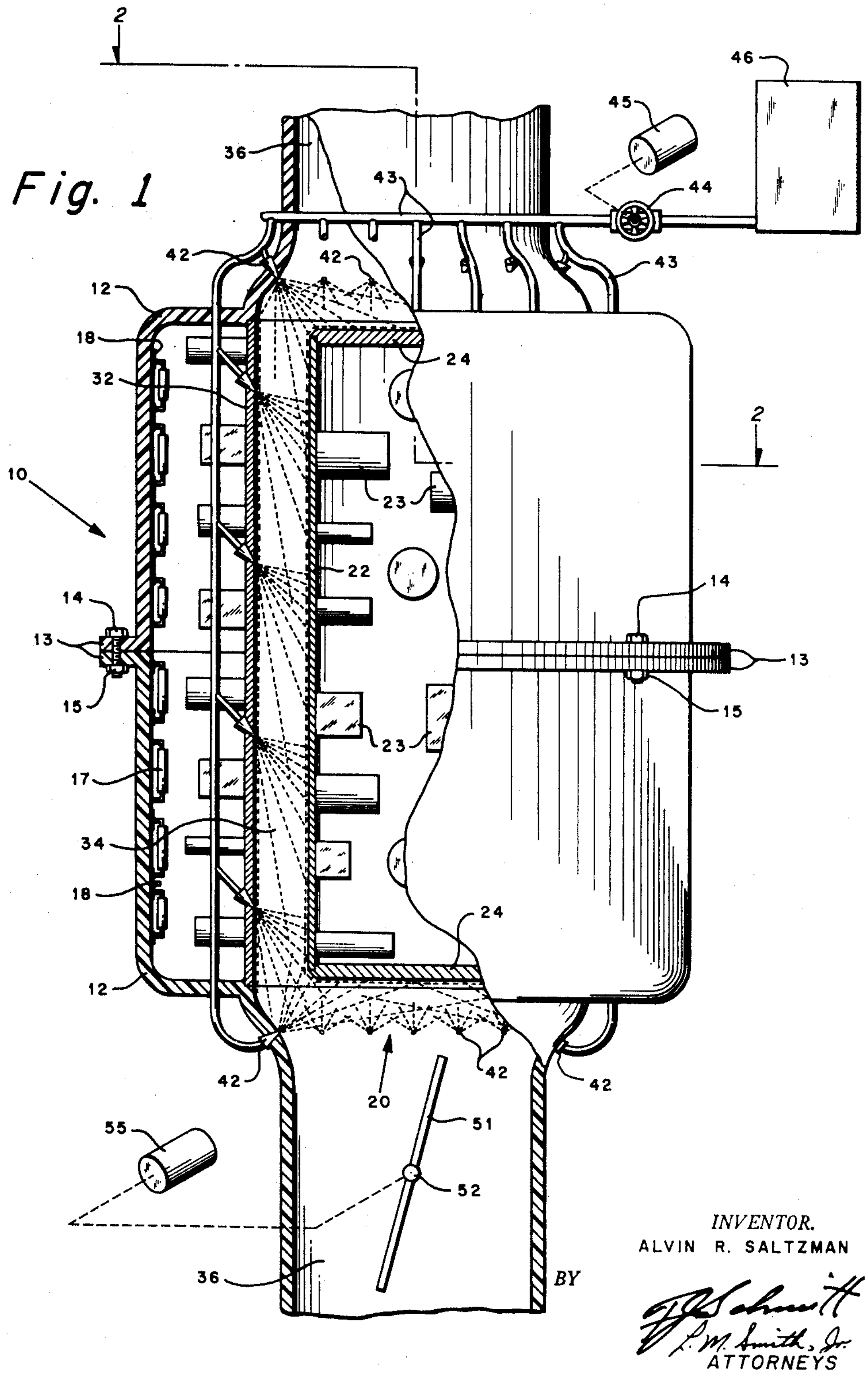

(Granted under Title 35, U.S. Code (1952), sec. 266)

The invention described herein may be manufactured and used by or for the Government of the United States of America for governmental purposes without the payment of any royalties thereon or therefor.

This invention relates to an improved chassis design for an inert carrier gas-liquid thermal diffusion cooling system and more particularly to an improved chassis design which provides an effective means for separation of various components of electronic equipment by operating temperature level and for directing the heat generated by such components to a heat sink adequate for cooling under various operating conditions including those encountered at high Mach numbers and at high flight altitudes.

Conventional chassis for electronic equipment are typically constructed of metallic sheet material of sufficient strength and rigidity to support and enclose the various components of the equipment, and the electrically conducting characteristics of such metallic containers precludes the use of such surfaces for the direct mounting of electronic components which require electrical insulation therebetween. In response to the clearly evidenced need for positive means of cooling many such electronic equipments, especially where they must be installed in severely limited spaces as within an aircraft fuselage, various known types of cooling means of limited efficiency have been provided to supply such positive cooling. For example, in many installations, air has been circulated through the chassis to pass in direct contact with various heat generating electronic components, thereby serving as a cooling medium. However, the efficiency of such a system is severely limited by the difficulty encountered in attempting to provide effective means for directing an adequate flow of air to all critical areas under the severe space limitations and weight restrictions often imposed on such equipment. In addition, the low specific heat of air and the low density of air available at high altitudes severely limit the capabilities of air as a coolant fluid, especially in electronic equipments intended for use in modern high performance aircraft. Alternative systems have provided for bathing heat generating electronic components in refrigerant fluids such as Freon 113. However, such installations are penalized by the requirement for a complete refrigerating system to be associated therewith to return the heated Freon gas to a liquid state and to remove the accumulated heat therefrom. Any attempt to increase the capacity of such a system to meet more rigorous operating conditions requires increased capacity of the refrigerating system and thereby exacts a severe weight and space penalty. With the advent of aircraft capable of operating at extreme altitudes where the density of the atmosphere is substantially reduced, serious operating difficulties have been encountered in electronic equipments exposed to rarified atmosphere. Accordingly, pressurized chassis are commonly resorted to with the disadvantage that cooling in such installations is frequently limited to directing cooling air over the exterior surface of the pressurized chassis, a technique which affords little or no protection against the development of excessive temperatures at localized hot spots within the chassis. Moreover, at low altitudes and high Mach numbers, the so-called cooling air available is often initially hotter than the safe operating temperature of the equipment to be cooled.

In contrast to the various inherent limitations of the prior art teachings enumerated above, the instant invention contemplates the incorporation of substantially more efficient cooling means of the type taught in the copending application of Alvin R. Saltzman, Serial No. 587,183, filed May 24, 1956, for Thermal Diffusion Desorption Cooling System and, in addition, contemplates the use of such a cooling means as a barrier between a zone encompassing high heat generating components from a zone encompassing electronic components operating at a substantially lower temperature and hence generating relatively little heat as well as providing means for directing the heat generated by the various components to such cooling means so that it functions most effectively as a heat sink.

An object of this invention is the provision of means for separating the low temperature components of electronic equipment from the high heat generating components thereof to protect the low temperature components from the deleterious effects of excessive heat.

Another object is the provision of a high capacity cooling means within the chassis of electronic equipment, so disposed therein that it forms a barrier between low temperature components of the equipment and high heat generating components thereof.

Still another object is to provide for directing heat generated within operating electronic equipment to means provided within the chassis enclosing such equipment for effectively dissipating heat generated therein.

Yet another object of this invention is the provision of a compact lightweight chassis for electronic equipment characterized by substantially more surface area per unit volume for mounting electronic components than conventional chassis designs provide.

A final object is to provide a compact lightweight chassis for electronic equipment capable of maintaining safe operating temperatures for various components of such equipment in a high temperature environment with a minimized expenditure of a cooling fluid by means of intermittent circulation of the cooling fluid at predetermined regular time intervals effective over a wide range of operating conditions including high Mach numbers and high altitude conditions to maintain the temperature of electronic equipment so protected within a safe operating temperature level.

Figure 2:
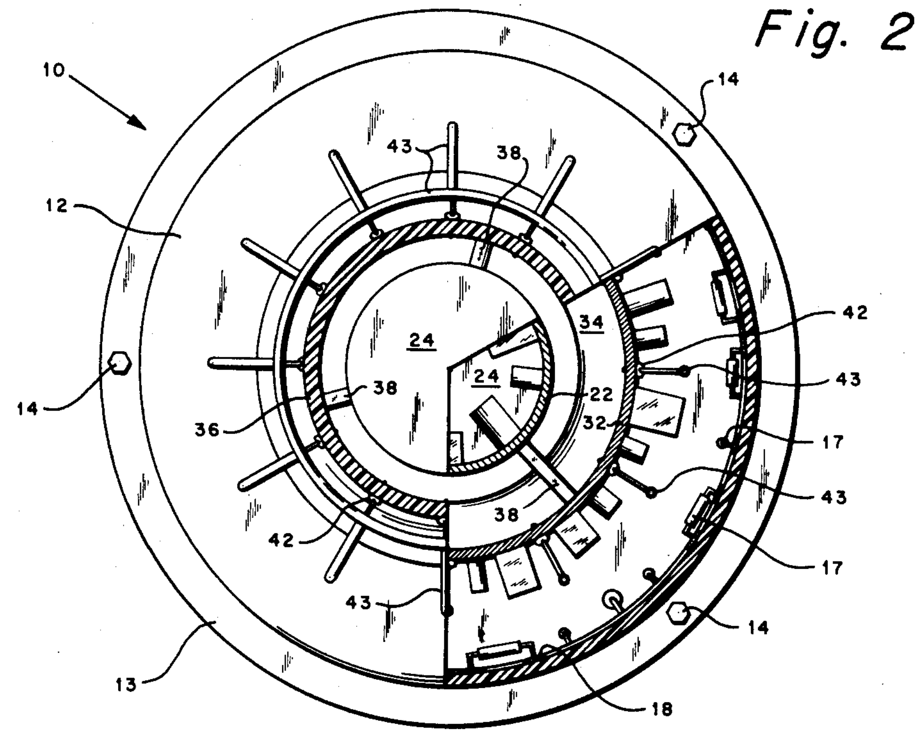
Figure 3:
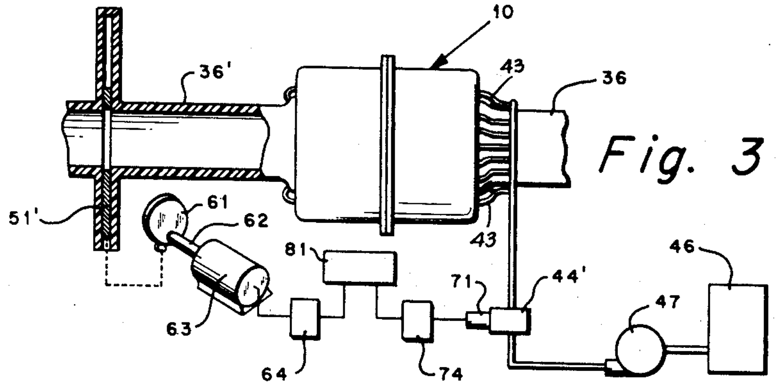
Figure 4:
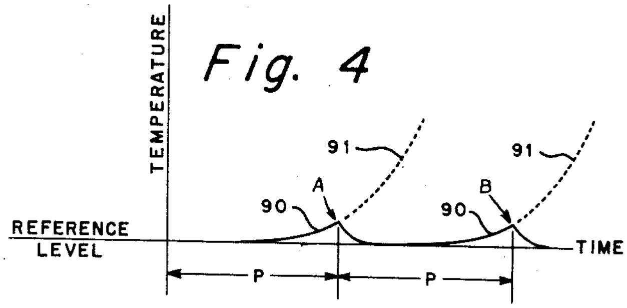

Further objects and advantages of the instant invention will become apparent upon consideration of the description thereof below taken with the showing in the attached drawings wherein:

Fig. 1 is a side view, partially broken away, of a preferred embodiment of the instant invention, Fig. 2 is an end view, sectioned along line 2—2 of Fig. 1, of the embodiment of the instant invention illustrated in Fig. 1, Fig. 3 is a schematic representation of the instant invention illustrating additional features which in cooperation with the components of the instant invention illustrated in Figs. 1 and 2 provide increased flexibility of operation of the instant invention, and Fig. 4 illustrates a typical time temperature relationship for operation of the instant invention using the features illustrated in Fig. 3.

Referring now to the drawings, Fig. 1 shows a chassis for electronic equipment generally designated by the reference numeral 10 including an outer casing or container which may conveniently comprise a pair of opposed generally similar outer wall portions 12 fitted together and fixedly connected by any suitable joint structure such as flanges 13 projecting therefrom and a plurality of bolts 14 and nuts 15. The outer wall portions 12, together corresponding to the container 16 disclosed in co-pending application Serial No. 587,183 are preferably fabricated from a rigid material with a low thermal diffusivity such as cellulose acetate, ceramic or other suitable non-metallic substance in order to insulate equipment contained therein from any unfavorable temperature differential between the interior of the chassis and the environment in which the chassis is located; the thermal diffusivity for a given material being a constant D, determined by the formula:

$$D=\frac{K}{c_p e}$$

where $K$=thermal conductivity of the material
$c_p$=specific heat of the material at a constant pressure
$e$=density In any given installation, once the material to be used in the outer wall portions 12 has been selected the most satisfactory thickness of these wall portions must be selected for optimum heat insulating characteristics in the light of anticipated flight conditions and particularly the ambient temperature to assure a minimum rate of change of temperature within the anticipated time of flight, according to the well-known relationship of significant factors as follows:

$$\frac{dU}{dt}=D\frac{d^2U}{dX^2}$$

where $U$=temperature
$t$=time
$X$=thickness of the material

In addition, noting that typical heat insulating materials of the types indicated above as suitable for use in fabricating portions 12 are also electrical insulators, various components of an electronic equipment characteristically operating at relatively low temperatures such as small resistances and capacitors 17 may be mounted upon the inner surfaces of portions 12. In fact, printed circuitry 18 may be applied directly to the inner surfaces of portions 12 to effect a saving in weight and facilitate installation of the electronic equipment to be housed in chassis 10. For the same reason, the outer wall portions 12 may satisfactorily be used also as terminal boards to eliminate the need for separate elements of this type.

The outer container composed of outer wall portions 12 encloses an inner container generally designated by the reference number 20 which in this embodiment comprises a cylindrical outer wall 22 closed at its opposite ends by circular end plates 24 to form a sealed generally cylindrical container in which various high heat generating electronic components 23 may be mounted, preferably by attachment directly to the wall 22 or the end plates 24. The wall 22 and the end plates 24 of the inner container 20 may conveniently comprise metallic sheet material since these surfaces serve in a dual capacity, first in the conventional sense as the electrically conducting chassis for the electronic equipment closed thereby and second, as a primary heat transfer surface for the cooling means of the instant invention, both of which capacities are well served by the properties characteristic of metallic materials. The inner container 20 is in turn surrounded by a relatively larger cylindrical wall 32 extending between the end portions of the respective outer wall portions 12 to form in combination with these portions an annular chamber for various electronic components of the electronic equipment enclosed in the instant invention which characteristically operate at relatively lower temperatures. The wall 32 may conveniently be fabricated from metallic sheet material since it is required to function in the same dual capacity as wall 22, first as an electrically conducting secondary chassis for the direct mounting of electronic equipment, and second, as a high heat transfer wall. In addition, wall 32 must be so disposed relative to wall 22 as to define an annular passageway 34 therebetween formed throughout by generally parallel surfaces spaced apart a distance of the order of approximately three-eighths of an inch within which a cooling liquid is diffused and through which a gaseous fluid such as air is circulated in the manner described in detail in co-pending application Serial No. 587,183. The exact spacing between the respective surfaces of the passageway 34, greatly exaggerated in the showings in Figs. 1 and 2, must of course be selected for optimum performance taking into account the size of the chassis, the amount of heat to be disposed of, and the requisite flow of fluid through the passageway for this purpose. The respective ducts 36 connecting with the opposite ends of the annular passageway 34 as illustrated comprise integral extensions of the outer wall portions 12. Alternatively, these ducts may be formed integrally with or be fabricated for connection to the opposite extremities of wall 32.

Since a chassis embodying the teachings of the instant invention may be fabricated to accommodate many different items of electronic equipment, no significant details of the electronic equipment enclosed thereby are disclosed herein, because no specific features of such equipment are in any sense a part of this invention. Instead, schematic representations of typical types of components common to many specific electronic equipments are generally represented in the showing in Figs. 1 and 2. Moreover, notwithstanding the fact that the illustrative embodiment of the instant invention is indicated to be generally cylindrical in configuration and to be disposed vertically as shown in Fig. 1, it is to be understood that the configuration and orientation of the chassis disclosed herein may be varied widely with respect to its size, shape, and the orientation of the components of the cooling means such as passageway 34 as necessary to support and adequately cool various types of electronic equipment and to accommodate such equipment within the limited amount and special configuration of the space typically provided therefor in closely confined installations such as those within an aircraft, for example. Finally, although a single annular passageway 34 is shown in Fig. 1, it is to be understood that a plurality of such passageways either similar or dissimilar in size and shape may be provided as necessary in a single chassis to accommodate and adequately cool the high heat generating components of various electronic equipments, keeping in mind that all such annular passageways must be arranged to conform to the design criteria enumerated in co-pending application Serial No. 587,183.

The nozzle assemblies 42 illustrated in Fig. 1 are shown mounted upon the wall 32 and arranged to project into the passageway 34. While this configuration may be generally satisfactory for diffusing the liquid throughout the passage, it may not be fully effective in all embodiments of the instant invention to maintain the cool liquid-thin protective film on the facing surfaces of both of the walls 22 and 32, as required for successful operation of the instant invention. Hence, nozzle assemblies may also be mounted upon the wall 22 and be interconnected by manifolds corresponding to the manifolds 43 illustrated in Fig. 1. Alternatively, when nozzle assemblies mounted in one wall prove to be sufficient, the nozzle assemblies may be mounted in wall 22 instead of in wall 32, particularly when this arrangement is more convenient, as when means are provided for first circulating the coolant liquid around components within the inner container 20 in the manner illustrated in Fig. 4 of co-pending application Serial No. 587,183. While similar auxiliary cooling can also be provided within the outer chamber outside of wall 32 by similarly circulating the coolant liquid around components in the outer chamber, proper segregation of the high heat generating components should preclude the need for such an arrangement in the outer chamber.

Referring further to Fig. 1, it should be noted that the nozzle assemblies 42, interconnected by a plurality of manifolds 43 in turn connected through a control valve 44 and thence through a pump assembly as shown in Fig. 3, if necessary, to a suitable reservoir 46, are primarily intended to be illustrative only and are generally equivalent to the nozzle assemblies 21, 21', and 21" similarly disposed in the showing in Fig. 1 of co-pending application Serial No. 587,183. In fact, upper, intermediate, and lower nozzle assemblies 42 may likewise be independently controlled by a series of separate control valves independently regulating the flow through several separate manifolds. However, it is to be understood that the teachings of alternative configurations of the liquid diffusing means illustrated in Figs. 2 through 4 of co-pending application Serial No. 587,183 are equally applicable to the instant invention. Similarly, the representation of a butterfly valve 51 rotatable around a shaft 52 in the lower duct 36 illustrated in Fig. 1 constitutes a representation of one convenient means for regulating the flow of air through the ducts 36 and the annular passageway 34 interconnecting these ducts. Finally, the reservoir 46 may be pressurized if by this arrangement the need for a pump assembly can be eliminated.

While the control valve 44 and the butterfly valve 51 illustrated in Fig. 1 can be controlled manually to adjust the device comprising the instant invention for operation under diverse operating conditions they may, of course, be controlled by suitable automatic means therefor such as synchro motors 45 and 55, respectively, illustrated schematically in Fig. 1 as mechanically connected to the control valve 44 and the shaft 52 supporting the butterfly valve 51. These synchro motors, in turn, may be controlled by remotely located synchro transmitters, not illustrated, in the conventional and widely known manner. In fact, for coordinated operation of the control valve 44 and the butterfly valve 51 the respective synchro motors 45 and 55 may be controlled by a single remotely located synchro transmitter regulated by the pilot of an aircraft.

Referring next to Fig. 2, this view is partially broken away to clearly show the relative orientation of the outer wall portions 12 and the ducts 36 and the disposition within the container of the cylindrical walls 22 and 32 maintained in proper spaced relation by suitable supporting means such as spacing rods 38 arranged to provide support for the inner container 20 composed of wall 22 and end plates 24 and preferably shaped and spaced to afford minimum interference with flow of the fluid through the annular passageway 34. Incidentally, spacing rods 38 may conveniently be hollow to accommodate necessary electrical conductors passing between the inner container and the outer container and, where necessary, they may accommodate liquid conduits for the transfer of liquid to be discharged into the passageway 34.

In operation, the high heat generating components of an electronic equipment supported by a chassis constructed according to the teachings of the instant invention will generate substantial quantities of heat within the inner container 20 of the chassis composed of the generally cylindrical wall 22 and the end plates 24 all of which constitute highly effective heat transfer walls. In addition, the components of the electronic equipment operating at relatively low temperatures and therefore generating relatively small quantities of heat, located within the annular chamber defined by the mating outer wall portions 12 and the annular heat transfer wall 32 will generate additional quantities of heat also requiring dissipation.

However, noting the relatively high heat insulating properties of the outer container composed of outer wall portions 12 in contrast to the relatively low heat insulating properties of the heat transfer wall 32 and its concomitant high heat transfer capabilities the additional quantity of heat generated by the low temperature operating components of the electronic equipment will be directed principally to and through the wall 32.

As noted above, the cooling means of the instant invention comprising the diffuser element including inlet and outlet ducts 36 and the intervening annular passageway 34 defined by the respective heat transfer walls 22 and 32 is essentially the same as and operates in the same manner as the diffusers disclosed in the various embodiments of the chassis disclosed in co-pending patent application Serial No. 587,183, with the exception of one significant difference. Since the diffusers disclosed in co-pending application Serial No. 587,183 are arranged to provide cooling for a single chamber enclosing and supporting all of the components of an electronic equipment, such diffusers include an annular passageway defined by one high heat transfer wall and one heat insulating wall when the outer wall thereof is formed of material demonstrating heat insulating properties. In contrast, the diffuser characteristic of the instant invention is necessarily provided with two effective high heat transfer walls together defining the characteristic annular passageway of the diffuser. Hence, it is essential in the instant invention that the liquid diffusing means provided in the diffuser of the instant invention, such as multiple nozzle assemblies 21', packing material 29, or annular diffusing assemblies 30, as illustrated in co-pending application Serial No. 587,183 be effective to maintain a cool liquid-thin film protective layer on the facing surfaces of both of the walls 22 and 32 in addition to their second function of maintaining a very large total liquid surface within the passageway 34 for most effective diffusion of the liquid supply in the air circulated through the passageway.

Although the inlet and outlet ducts 36 disclosed in Fig. 1 are illustrated as extending substantially in axial alignment with the annular passageway 34 the relative disposition of either or both of these ducts may be modified as necessary to accommodate the limitations of a particular installation. Alternatively, these ducts may be arranged substantially tangentially of the annular passageway 34 in the manner illustrated in Fig. 5 of copending application Serial No. 587,183. Moreover, although the showing in Fig. 1 embodying the teachings of the instant invention shows the components of an electronic equipment disposed in two separate compartments at only two discrete temperature levels, where the disparity between the normal operating temperature levels of various components is sufficiently large, more than two separate chambers for various components may be provided in a single chassis as by providing a plurality of generally cylindrical diffuser assemblies concentrically disposed and spaced apart to form a plurality of separate zones in which components operating at discrete temperature levels may be accommodated, separated by cooling means as disclosed herein interposed therebetween, which may have tangent inlets and outlets.

Alternatively, a plurality of chassis embodying the teachings of the instant invention may be interconnected in a series arrangement in the manner illustrated in Fig. 6 of copending application Serial No. 587,183 in order to make most effective use of the cooling medium employed, for cooling components operating at a plurality of temperature levels.

A further refinement of the instant invention may be provided by including therein means illustrated schematically in Fig. 3 for cyclically releasing a flow of the coolant fluid and a coordinated flow of the gaseous vehicle therefor at predetermined spaced intervals and for a predetermined period of time to achieve a pulsed or intermittent cooling operation resulting in reduced consumption of the coolant liquid. As shown in Fig. 3, the chassis generally designated by the reference numeral 10 is provided with an outlet duct 36 corresponding to that in Fig. 1 and with an inlet duct 36' differing from that shown in Fig. 1 only in that a transversely sliding valve element 51' or gate valve is substituted for the butterfly type valve 51 illustrated in Fig. 1. The flow of liquid from the reservoir 46 via the pump assembly 47 and thence through the manifolds 43 to the various nozzle assemblies is here controlled by a suitable control valve 44' which may be actuated by a conventional solenoid 71 in turn actuated at predetermined intervals by a cyclically operable control means therefor 74 which may, for example, comprise a rotary switch assembly operable at various speeds to control the frequency of operation of the solenoid 71. The reciprocating cyclical displacement of the valve means 51' within the inlet duct 36' to regulate the flow of gaseous fluid therethrough is shown as regulated by a suitable rotatable cam surface 61 connected by means of shaft 62 to a suitable driving means such as an electric motor 63, the operation of which is in turn regulated by a cyclically operable control means therefor 64, which may comprise a rotary switch assembly operable at various speeds to regulate the intervals of operation for valve 51'. Since the operation of the valve means 51' and of the valve 44' must be coordinated both as to phasing and duration of flow for satisfactory pulsed operation of the instant invention, it is desirable that the respective control means therefor, control means 64 and 74, respectively, be regulated by a single master control unit 81. In fact, the master control unit 81 may, in fact, constitute a single control assembly for the entire system including a single rotary switch assembly or a pair of mechanically interconnected and hence coordinated rotary switch assemblies for controlling motor 63 and the solenoid 71.

It will be recalled that the instant invention as illustrated in Fig. 1 is designed to operate continuously to maintain a substantially constant operating temperature over an extended period of operation within a given range of operating conditions. From consideration of the representative time-temperature relationship shown in Fig. 4 for the configuration of the instant invention illustrated in Fig. 3, it will be noted that this configuration, arranged to operate intermittently, produces a resultant cyclically variable temperature level which closely approximates the substantially constant temperature level achieved by continuous operation. Starting at a temperature identified in Fig. 4 as the reference level which may equal or be slightly less than the substantially constant temperature maintained by continuous operation for a given equipment, the temperature rises slowly along the curve 90 during a time interval P with the valve means 51' and the valve 44' closed and the cooling means thus rendered inoperative. Adjacent to a point A valve means 51' and the valve 44' are opened to permit the passage of a pulse of the coolant liquid through the valve 44' and flow of the gaseous vehicle therefor through the valve means 51'. The result is a reduction in temperature to a point approximating the so-called reference level as a result of the cooling effect thus achieved, while without operation of such a cooling means the temperature would have continued to rise along curve 91. After a pulse of coolant fluid is introduced through the chassis another interval P passes before the next succeeding pulse is transmitted commencing adjacent to point B. Thus, while the operating temperature does fluctuate in this mode of operation the degree of fluctuation is maintained at a relatively small level within the temperature tolerances of the various components of the equipment, a result which may be assured by properly selecting the pulse rate and the duration of each of the individual pulses.

With regard to the duration of pulses, it should be noted that this duration is not necessarily predicated upon the temperature variation achieved within a given time span. Instead the duration of the pulse may be determined by the necessity for selecting a time interval such that the desired chemical reaction is achieved between the liquid and gaseous fluids admitted to the chassis during the pulse.

In addition, the periods in which the coolant liquid and the gaseous vehicle are passed need not be entirely coincident. Instead, the pulse duration and the phasing of the respective fluids may be varied as necessary under various operating conditions and with various requirements for heat transfer to achieve optimum results by providing independent although coordinated control means for regulating the flow of the liquid and gaseous fluids, respectively.

The configuration of the instant invention illustrated in Fig. 3 is characterized by a considerable reduction in the rate of fluid consumption required to give the desired cooling effect within permissible limitations as to increase of component temperature. In addition, this configuration requires substantially reduced quantities of air which is of considerable advantage in aircraft installations because substantially less fuel is consumed in overcoming the momentum drag. Furthermore, optimized exploitation of the latent heat of vaporization of the cooling liquid is achieved in this configuration due to enhanced mixing and mass transfer effects with minimum entrainment of liquid fluid. Finally, use of the pulsing technique possible with the configuration shown in Fig. 3 permits flexible control of component temperatures within an equipment throughout widely variable flight conditions.

Thus, the instant invention provides an improved chassis assembly for electronic equipment, particularly suitable for use where cooling requirements therefor are critical and where the equipment must be cooled effectively under diverse operating conditions as, for example, in the electronic equipments required for use in modern high performance aircraft. The device of the instant invention, making use of the principle of simultaneous, heat, mass, and momentum transfer by the diffusion of a quantity of cooling liquid within the confines of a closely restricted passageway and the entrainment of the liquid so diffused in a turbulent stream of air circulated therethrough, operating principally as a carrier of vapor heat rather than as a coolant, additionally provides a barrier between zones within the chassis housing high heat generating components and low temperature operating components, respectively, of an electronic equipment, which barrier constitutes the cooling means for the chassis, and further provides for directing heat generated by components of the electronic equipment to the cooling means constituting a heat sink therefor.

Obviously many modifications and variations of the present invention are possible in the light of the above teaching. It is, therefore, to be understood that within the scope of the appended claims the invention may be practiced otherwise than as specifically described.

What is claimed is:

1. In a hollow container for heat generating elements provided with interior surfaces defining a passageway therethrough; cooling means for said container comprising said interior walls, liquid discharging means projecting into the passageway, a first flow control means, adjustable between closed and open positions for regulating the flow of liquid through said liquid discharging means, inlet and outlet means connected to the passageway for circulation of a gaseous fluid therethrough, a second flow control means adjustable between closed and open positions for regulating the flow of gaseous fluid through the passageway, first drive means cyclically operable to move said first control means successively from a fully closed position to a fully open position and thence to a fully closed position, second drive means cyclically operable to move said second control means successively from a fully closed position to a fully open position and thence to a fully closed position, and regulating means automatically operable independent of temperature level to produce cyclic coordinated operation of said first and said second drive means to move said first and said second control means from their respective closed positions to their respective open positions and thence to their closed positions at predetermined regular time intervals.

2. A container for at least one source of a relatively large quantity of heat and for at least one source of a relatively small quantity of heat, said container comprising a fully enclosed outer shell, a fluid barrier mounted within said outer shell and arranged to divide the container into first and second chambers, the first chamber enclosing at least one source of a relatively large quantity of heat and the second chamber enclosing at least one source of a relatively small quantity of heat, said fluid barrier comprising a cooling means including first and second walls spaced apart to form a passageway therebetween and forming portions of the first and second chambers, respectively, of said container, said first and said second walls being composed of heat conducting sheet material, liquid discharging means projecting into the passageway defined by said first and said second walls and arranged to establish coolant liquid-thin film protective layers upon the facing surfaces of said first and second walls, respectively, liquid diffusing means arranged in relation to the passageway defined by said first and said second walls so that said liquid diffusing means maintains a large liquid surface area within the passageway, a first control means for regulating the flow of liquid through said liquid discharging means and said liquid diffusing means, inlet and outlet ducts mounted upon said container and connecting with the passageway defined by said first and said second walls, by means of which a gaseous coolant fluid may be circulated through the passageway, a second control means for regulating the flow of gaseous fluid through said ducts and the passageway interposed therebetween, first drive means cyclically operable to move said first control means successively from a fully closed position to a fully open position and thence to a fully closed position, second drive means cyclically operable to move said second control means successively from a fully closed position to a fully open position and thence to a fully closed position, and regulating means automatically operable independent of temperature level to produce cyclic coodinated operation of said first and said second drive means to move said first and said second control means from their respective closed positions to their respective open positions and thence to their closed positions at predetermined regular time intervals.

3. An elongated generally cylindrical hollow container composed of relatively rigid heat conducting sheet material, a generally cylindrical element composed of heat conducting sheet material and having an inside diameter slightly larger than the outside diameter of said container, means for supporting said cylindrical element concentrically of and spaced from said container to form a narrow annular passageway therebetween, an elongated generally cylindrical outer shell composed of heat insulating sheet material and interconnected at its opposite ends to the opposite ends of said cylindrical element to form an annular chamber disposed concentrically of said container, liquid discharging means projecting into the passageway defined by said container and said element and arranged to establish coolant liquid-thin film protective layers upon the facing surfaces of said container and said element, respectively, liquid diffusing means arranged in relation to the passageway defined by said container and said element so that said liquid diffusing means maintains a large liquid surface area within the passageway, a first flow control means for regulating the flow of liquid through said liquid discharging means and said liquid diffusing means, inlet and outlet duct means respectively connected to the opposite ends of said elongated cylindrical element by means of which a gaseous fluid may be circulated through the passageway defined by said cylindrical element and said container, second flow control means for regulating the flow of gaseous fluid through said duct means and the passageway therebetween, first drive means cyclically operable to move said first control means successively from a fully closed position to a fully open position and thence to a fully closed position, second drive means cyclically operable to move said second control means successively from a fully closed position to a fully open position and thence to a fully closed position, and regulating means automatically operable independent of temperature level to produce cyclic coordinated operation of said first and said second drive means to move said first and said second control means from their respective closed positions to their respective open positions and thence to their closed positions at predetermined regular time intervals.

References Cited in the file of this patent

UNITED STATES PATENTS

| | | |
|---|---|---|
| 2,176,841 | Hanson | Oct. 17, 1939 |
| 2,750,754 | Schmidt | June 19, 1956 |

OTHER REFERENCES

Electrical Manufacturing, October 1955, pages 106–113, published by The Gage Publishing Company.